United States Patent
Otto et al.

(10) Patent No.: US 10,386,406 B1
(45) Date of Patent: Aug. 20, 2019

(54) BACK GATE TUNING CIRCUITS

(71) Applicant: GLOBALFOUNDRIES INC., Grand Cayman (KY)

(72) Inventors: Michael Otto, Weinboehla (DE); Jan Höntschel, Dresden (DE); Maximilian Jüttner, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/887,417

(22) Filed: Feb. 2, 2018

(51) Int. Cl.
*G01R 31/27* (2006.01)
*G01R 31/30* (2006.01)

(52) U.S. Cl.
CPC .......... *G01R 31/275* (2013.01); *G01R 31/30* (2013.01)

(58) Field of Classification Search
CPC ...... G01R 31/275; G01R 31/30; G11C 16/12; G11C 11/5621; G11C 13/0007; H01L 27/088; H01L 27/092; H01L 27/0928; H01L 29/78; H01L 27/14601; H01L 27/14603; H01L 27/14614; H03K 17/08142; H03K 17/102; H03K 19/00315; H03K 19/018521; H03K 17/166; H03K 19/0013
USPC ....................................................... 257/207
See application file for complete search history.

(56) References Cited

U.S. PATENT DOCUMENTS

| | | |
|---|---|---|
| 7,049,898 B2 | 5/2006 | Banerjee et al. |
| 8,432,760 B2 | 4/2013 | Deng et al. |
| 2007/0158710 A1* | 7/2007 | Mheen .............. H01L 27/14614 257/291 |
| 2010/0066430 A1 | 3/2010 | Siprak et al. |
| 2013/0028036 A1 | 1/2013 | Deng et al. |

FOREIGN PATENT DOCUMENTS

| | | | |
|---|---|---|---|
| DE | 2837028 | 3/1979 | |
| DE | 69532887 | 4/2005 | |
| JP | 2004165911 | * 6/2004 | ........... H01L 21/822 |

OTHER PUBLICATIONS

Yoshikazu Nitta et al., "High-Speed Digital Double Sampling with Analog CDS on Column Parallel ADC Architecture for Low-Noise Active Pixel Sensor", IEEE International Solid-State Circuits Conference, Session 27, 2006, 8 pages.

Shunichi Sukegawa et al., "A 1/4-inch 8Mpixel Back-Illuminated Stacked CMOS Image Sensor", IEEE International Solid-State Circuits Conference, Session 27, 2013, 3 pages.

Drake A. Miller, "Random Dopants and Low-Frequency Noise Reduction in Deep-Submicron MOSFET Technology", Doctor of Philosophy in Electrical and Computer Engineering, Mar. 7, 2011, 164 pages.

German Office Action dated Jan. 10, 2019 for related DE Application No. 102018208456.4, 8 pages.

Taiwanese Office Action dated Mar. 19, 2019 for related TW Application No. 107116298, 9 pages.

* cited by examiner

*Primary Examiner* — Caleen O Sullivan
(74) *Attorney, Agent, or Firm* — David Cain; Andrew M. Calderon; Roberts Mlotkowski Safran Cole & Calderon, P.C.

(57) ABSTRACT

The present disclosure generally relates to semiconductor structures and, more particularly, to back gate tuning circuits and methods of manufacture. The method includes applying a voltage to a back gate of a device; and selectively controlling the applied voltage to deactivate at least one trap within an insulating layer of the device to reduce noise contribution from the at least one trap.

20 Claims, 8 Drawing Sheets

BACK GATE TUNING CIRCUITS

FIELD OF THE INVENTION

The present disclosure generally relates to semiconductor structures and, more particularly, to back gate tuning circuits and methods of manufacture.

BACKGROUND

As devices continue to decrease in size, certain defects arise such as random telegraph noise (RTN). For example, RTN is a type of defect driven phenomena comprising electronic noise responsible for causing reliability issues in nanoscale devices such as image signal processors (ISP), dynamic random-access memory (DRAM), static random-access memory (SRAM) and flash memories, amongst other devices. As an example, RTN can limit the performance of an ISP device by preventing an achievable picture quality under low light conditions. Specifically, RTN can negatively influence the output of pixels, thereby preventing an achievable picture quality. In this way, RTN impacts yield, error rates, and image quality, amongst other areas.

SUMMARY

In an aspect of the disclosure, a method comprises: applying a voltage to a back gate of a device; and selectively controlling the applied voltage to deactivate at least one trap within an insulating layer of the device to reduce noise contribution from the at least one trap.

In an aspect of the disclosure, a method comprises: determining a transistor pair has a stable output or a varying output; applying a voltage to a back gate of the transistor pair when it has the stable output; and selectively controlling the applied voltage on or off to reduce traps in the transistor pair when the transistor pair has the varying output.

In an aspect of the disclosure, a system for improving noise performance comprises a CPU, a computer readable memory and a computer readable storage media; first program instructions to apply a voltage to a back gate of a device; and second program instructions to selectively control the applied voltage to deactivate at least one trap within an insulating layer of the device to reduce noise contribution from the at least one trap.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
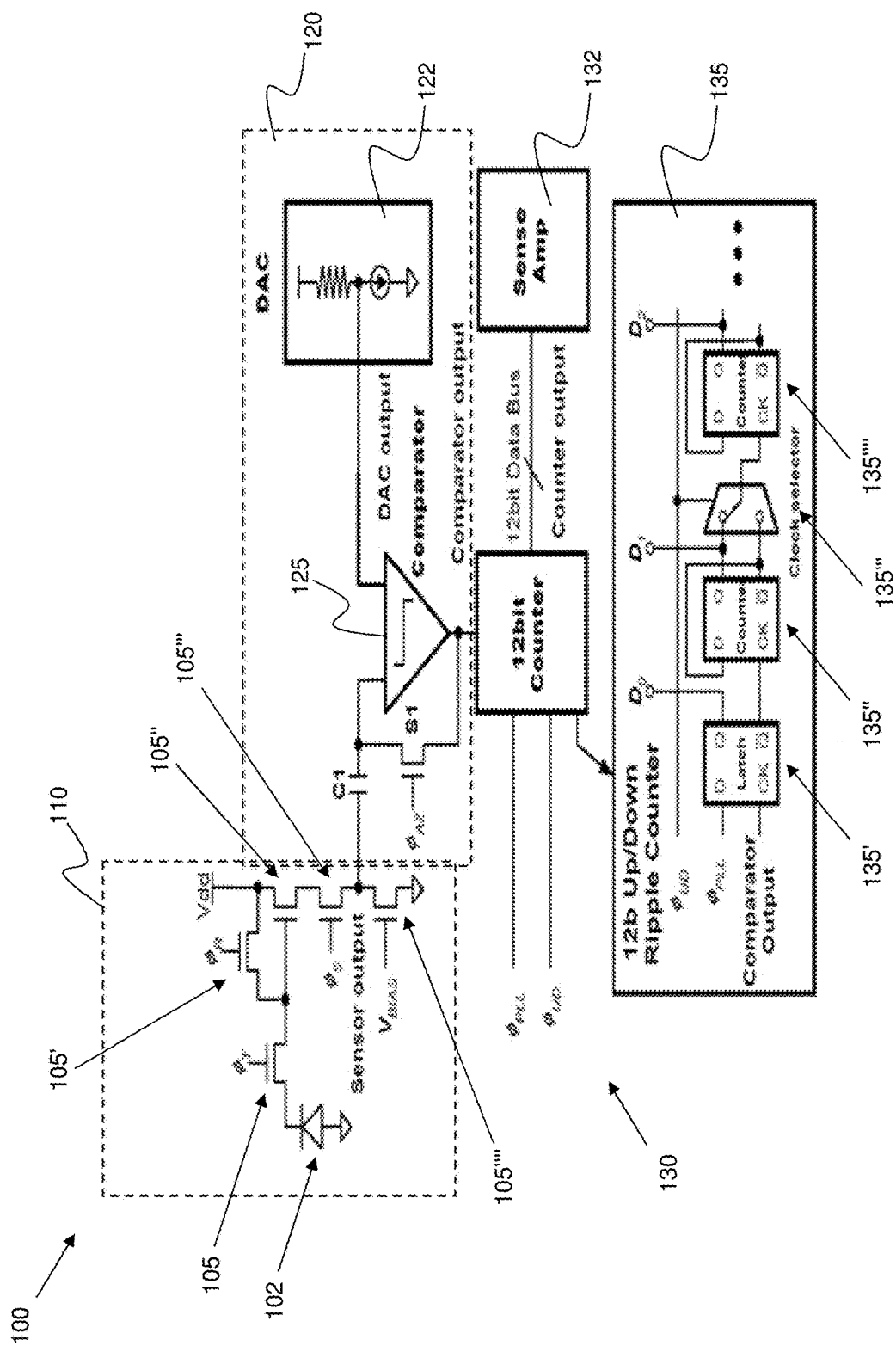
FIG. 1 shows a schematic illustration of a circuit and respective fabrication processes in accordance with aspects of the present disclosure.

The present disclosure generally relates to semiconductor structures and, more particularly, to back gate tuning circuits and methods of use and manufacture. In embodiments, the structures and processes described herein allow for a reduction in the amount of random telegraph noise (RTN) in a device by selectively controlling device traps related to defects inside the gate oxide. Advantageously, by controlling the activation of the device traps, an amount of RTN present will be reduced, thereby improving noise performance of the device.

Trap activation depends on voltage bias conditions, i.e., the gate source voltage ($V_{GS}$) and the drain to source voltage ($V_{DS}$). Accordingly, the RTN behavior of a device such as a bulk transistor is not changeable if a certain drain to source current ($I_{DS}$) in the circuit is needed. However, controlling the channel of the device, e.g., fully depleted silicon on insulator (FDSOI) devices, by applying a voltage of the back gate ($V_{BG}$), for a given $I_{DS}$, several combinations of $V_{GS}$ and $V_{BG}$ are possible. Further, due to the different electric field conditions of each combination, it is possible to have some traps become active, i.e., open, while other traps disappear, i.e., are deactivated. In this way, each individual transistor can be set to a $V_{GS}/V_{BG}$ combination which provides the best noise performance, i.e., the $V_{GS}/V_{BG}$ combination which reduces the most number of activated traps.

The circuits and processes described herein allow for a determination of a proper $V_{GS}/V_{BG}$ combination by using a training sequence after startup. Specifically, the circuits and processes described herein determine which devices are noisy and which devices are not by determining whether the $I_{DS}$ output for the transistor is stable or varies. In embodiments, the transistors with a stable output are considered not noisy, while transistors with a varying output are considered noisy. In operation, transistor/transistors (devices) which are not noisy can have their $V_{BG}$ maintained at a source supply voltage ($V_{SS}$), i.e., maintaining a back gate voltage of a device with a stable output at a first level voltage; whereas, for noisy transistors, the $V_{BG}$ can be switched from $V_{SS}$ to a drain voltage ($V_{DD}$), i.e., switching the back gate voltage of the device with a varying output to a second level voltage. In this example, the first level voltage is a source supply voltage $V_{SS}$ and the second level voltage is a drain voltage $V_{DD}$, with the back gate voltage $V_{BG}$ being at a first level voltage or a second level voltage. The switching of the $V_{BG}$ from $V_{SS}$ to $V_{DD}$ results in a reduction in the amount of active traps, thereby reducing RTN and improving the performance of devices, e.g., image signal processors. In further embodiments, each transistor can have an associated memory so that the setting of $V_{BG}$ is maintained for a length of time desired by the user.

Accordingly, the circuits and processes described herein can apply an appropriate $V_{BG}$ to the transistor for selective tuning of the back gate of the transistor. The selective tuning controls trap activation, resulting in an RTN reduction. In view of this selective tuning, noise performance of the device can be improved by up to approximately 45%, enabling a new class of very sensitive image signal processors. Additionally, the circuits and processes provided herein can implement the selective tuning by using two voltage levels for $V_{BG}$, e.g., first level voltage $V_{SS}$ and second level voltage $V_{DD}$. In this way, the circuits and processes described herein are relatively simple to integrate, with no back bias generator being needed, because no new voltage needs to be generated since the $V_{SS}$ and $V_{DD}$ voltages are already available.

FIG. 1 shows an illustrative schematic of circuit 100 for use in accordance with aspects of the present disclosure. In embodiments, the circuit 100 can be used in conjunction with an image sensor, e.g., a compact image sensor. In operation, the circuit 100 has a double-sampling architecture for removal of device variation and circuit offset in an image sensor. In embodiments, the circuit 100 can be a column-inline dual-CDS architecture which implements digital double-sampling, i.e., digital CDS and analog CDS, in parallel columns.

As shown in FIG. 1, the circuit 100 includes an image sensor 110, sensor processing circuit 120 and a counter circuit 130, amongst other features. In embodiments, the image sensor 110 can be an array type device, e.g., a complementary metal oxide semiconductor (CMOS) image sensor, for example. The image sensor 110 detects various pixels, e.g., 4T active pixel sensor (APS) pixels that can use hole accumulation diodes (HADs). HADs enable image sensors such as the image sensor 110 to realize ideal properties of low dark current, no kTC noise, and no image lag, amongst other benefits.

In embodiments, the image sensor 110 comprises a photodiode 102 and transistors 105, 105', 105'', 105''', 105''''. The photodiode 102 can be any suitable device which converts light into an electrical current, i.e., photocurrent, for pixel generation. In this way, electrons are generated when light enters into the photodiode 102. In embodiments, pixel operation requires three control signals, e.g., $\varphi_S$, $\varphi_T$, and $\varphi_R$, which can be controlled by row decoders. Specifically, the transfer signal $\varphi_T$ is applied to the gate of the transfer transistor 105 to transfer electrons charged in the photodiode 102, which is connected to a source of the transfer transistor 105, to a floating diffusion region. A reset transistor 105' has its source tied to the drain of the transfer transistor 105, while a drain voltage $V_{dd}$ is tied to the drain of the reset transistor 105'. To reset the pixels, i.e., reset the potential of the photodiode 102, the reset control signal $\varphi_R$ is applied to the gate of the reset transistor 105', thereby causing a reset level of the sensor output from the image sensor 110 to appear at a vertical pixel output.

The drive transistor 105'' has its gate tied to the drain of the transfer transistor 105 and the source of the reset transistor 105', and receives the voltage $V_{dd}$ in its source region. In embodiments, the drive transistor 105'' changes an output voltage of each unit pixel by changing a current of a source according to a variation in an electrode voltage of the floating diffusion region. The drain of the drive transistor 105'' is tied to the selection transistor 105''', which outputs a sensor output of each unit pixel to the source of the transistor 105''''. Specifically, the sensor output is generated according to a variation in the voltage of the floating diffusion region, as an analog signal in response to the selection signal $\varphi_S$ applied to the gate of the selection transistor 105'''. A biasing voltage $V_{BIAS}$ is applied to the gate of the transistor 105'''' to overcome any threshold voltage from the sensor output.

The sensor processing circuit 120 comprises a digital-to-analog converter (DAC) 122 and a comparator 125. In embodiments, the DAC 122 can be a single-slope ramp generator DAC, amongst other examples. The comparator 125 can be a column comparator, driven by the single-slope ramp generator DAC 122 and the pixel (sensor) output through the connecting series capacitor C1. In further embodiments, the comparator 125 can be an array of comparators, e.g., 2K comparators, with each comparator in the array having a critical input transistor pair. The worst or nosiest comparator in the array of comparators determines the picture quality of the sensor processing circuit 120, and is improved upon with the structures and processes described herein.

The comparator 125 includes multiple inputs for receiving signals which are to be compared by the comparator 125. Specifically, an input of the comparator 125 receives a signal from the DAC 122, while the other input of the comparator 125 receives the sensor output from the selection transistor 105''' from the capacitor C1. In this way, the comparator 125 compares the DAC signal from the DAC 122 and the sensor output from capacitor C1. Furthermore, the input of the comparator 125, which receives the sensor output, and an output of the comparator 125 are connected through a transistor 51, thereby eliminating an offset of the comparator 125 and the sensor output which can cause a noise, when the control signal $\varphi_{AZ}$ is turned on.

The counter circuit 130 comprises a sense amp 132 and a counter 135. In embodiments, the counter 135 can be a 12-bit up/down ripple counter which comprises a column latch 135', ripple counters 135'',135''' and a clock selector 135''''. The column latch 135' comprises multiple inputs, with an input receiving the output from the comparator 125 and the other input receiving a clock output $\varphi_{PLL}$ from a high-speed clock not shown. The column latch 135' comprises multiple outputs, i.e., output $D_0$ and a second output which is received by the ripple counter 135''. The ripple counter 135'' comprises multiple inputs and multiple outputs, with an input receiving the output from the column latch 135', and another input tied to an output of the ripple counter 135''. The other output of the ripple counter 135'' outputs the output $D_1$.

A clock selector 135''' comprises multiple inputs and an output, with the output of the clock selector 135''' being received by an input of the ripple counter 135''''. The inputs of the clock selector 135''' receive the output $D_1$ and the other output from the ripple counter 135''. Further, an additional input of the clock selector 135''' receives the signal $\varphi_{UD}$. In this way, the ripple counters 135'',135'''' are set to a down counting period by the signal $\varphi_{UD}$, with the signal level of the signal $\varphi_{UD}$ appearing at the sensor output from the selection transistor 105''' when the control signal $\varphi_T$ opens the transfer gate. The ripple counter 135'''' comprises multiple inputs, with an input receiving the output from the clock selector 135''', while another input of the ripple counter 135'''' is tied to an output of the ripple counter 135''''. The other output of the ripple counter 135'''' outputs the signal $D_2$.

In embodiments, the ripple counters 135'',135'''' do not need to be synchronized with the clock outputting the clock signal $\varphi_{PLL}$. Further, an analog/digital (A/D) conversion of the reset control signal $\varphi_R$ is performed by counting the number of digital clock $\varphi_{PLL}$ cycles until an analog ramp voltage matches a vertical pixel output voltage. In this way, the ripple counters 135'',135'''' of the counter 135 are set to an up counting period, and digitally subtract the conversion of the reset control signal $\varphi_R$ from the sensor signal after the charge transfer from the photodiode 102, i.e., a digital correlated double sampling (CDS) stage. Specifically, digital CDS is obtained by changing the up/down counting of the ripple counters 135'' using the clock selector 135'''. By using a dual CDS, the analog pixel signal is converted to a corrected digital output signal in the individual columns in parallel. When the dual CDS is finished, the digital data is transferred to the column latch 135' included in each counter block of the counter 135.

Figure 2:
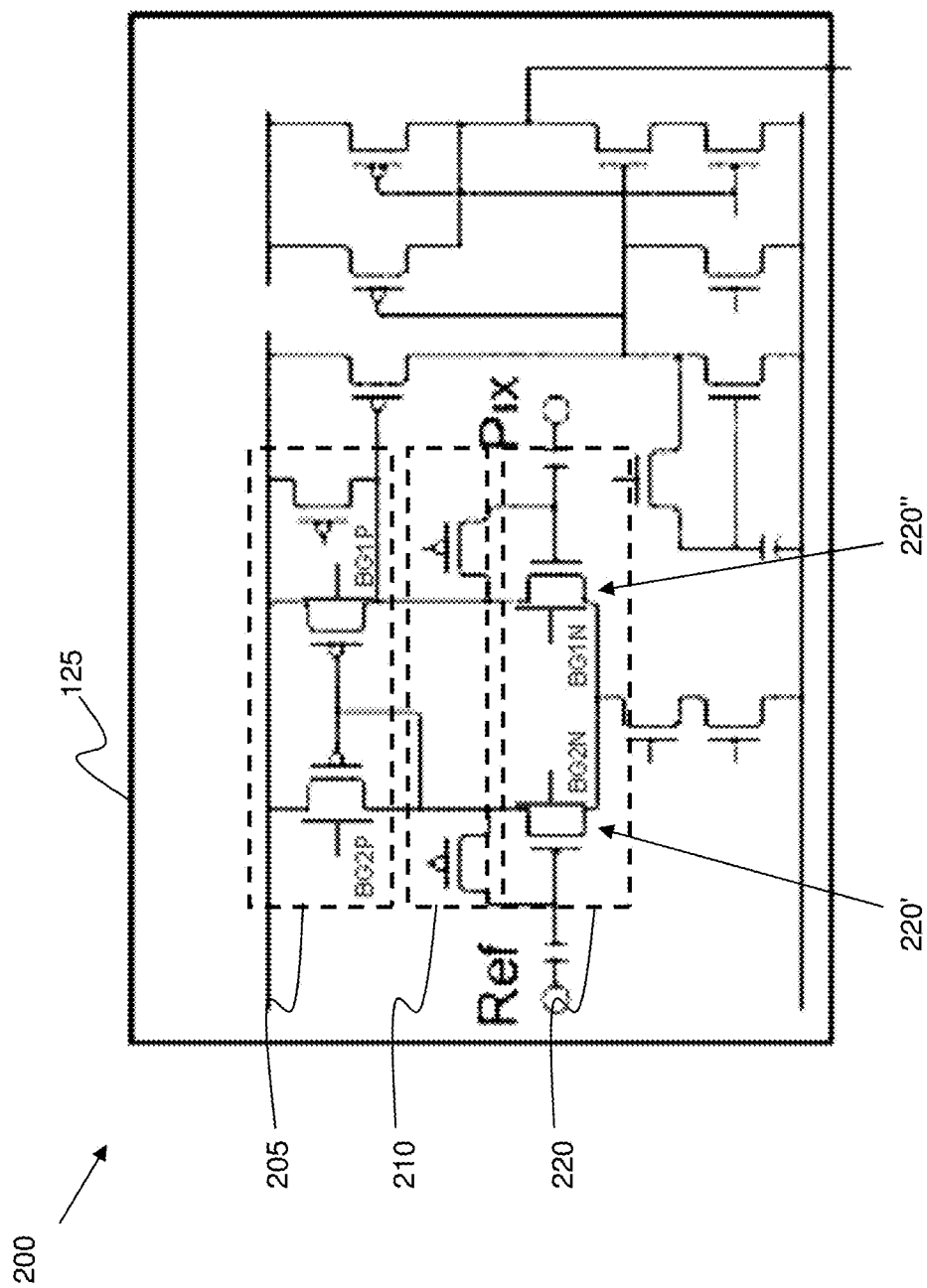
FIG. 2 shows a comparator circuit, amongst other features, and respective fabrication processes in accordance with aspects of the present disclosure.

FIG. 2 shows an illustrative schematic 200 of a comparator, e.g., comparator 125. The comparator 125 is designed to compare multiple signals, e.g., a reference signal and a signal which is desired for detection. In embodiments, the signals compared by the comparator 125 include the signal from the DAC 122 shown in FIG. 1, which serves as the reference signal, and the sensor output from the image sensor 110 shown in FIG. 1, i.e., the selection transistor 105''', which is the signal desired for detection. In embodiments, the comparator 125 comprises pFETs 205, transistors 210 arranged in parallel and input transistor pair 220 comprising the input transistors 220', 220''.

An array of transistors 210 connects the pFETS 205 to the input transistor pair 220. Noise generation, such as random telegraph noise (RTN), can occur because of trap activation in the oxides of the input transistors 220', 220'' of the input transistor pair 220. In this way, the input transistor pair 220 is a critical device, i.e., the input transistors 220', 220'' are each critical devices. In embodiments, the input transistors 220', 220'' can be FDSOI devices, which offers the option of controlling the channel with a voltage of the back gate $V_{BG}$. In this way, different back gate biasing techniques can be applied to the back gates of the input transistors 220', 220'' to provide trap deactivation, i.e., preventing a trap from contributing noise, by switching the $V_{BG}$ to different voltages, e.g., 3V to 0V, i.e., switching the voltage on or off to reduce traps in the input transistor pair 220 when the input transistor pair 220 has a varying output. Specifically, either input transistor 220' or the input transistor 220'' of the input transistor pair 220 can contribute noise from activated traps located within their respective gate oxides. In this way, either input transistor 220' or input transistor 220'' of the input transistor pair 220 can be selectively tuned, i.e., the back gate of either the input transistor 220' or the input transistor 220'' can be selectively tuned to alter the performance of the comparator 125. For example, if the input transistor 220' is found to be noisier than the input transistor 220'', a voltage back gate bias, e.g., a forward back bias (FBB), can be applied to the back gate of the input transistor 220', allowing for the noise performance of the input transistor pair 220 to be improved. In this way, the selective tuning of the back gate of the noisier transistor out of the input transistor pair 220 offers improved noise immunity because of the deactivation of the traps, which comprises deactivating the traps within a gate oxide of the transistor pair 220. In further embodiments, the back gates of both input transistors 220', 220'' can be selectively switched and tuned together, to further improve a layout of the circuit and to achieve a noise benefit, i.e., to further reduce the amount of RTN noise.

In embodiments, some devices are not noisy, while other devices can be noisy in view of RTN presence at each individual input transistor 220', 220'' of the input transistor pair 220. Accordingly, the circuits and processes described herein address the noisy transistor by using a training sequence after startup. The training sequence begins by determining which input transistor 220', 220'' of the input transistor pair 220 is noisy and/or noisier and which input transistor 220', 220'' of the input transistor pair 220 is not, in view of an amount of RTN present at each individual input transistor 220', 220''. In embodiments, the training sequence can be a multiple read out without pixel activation. In this way, the training sequence begins by taking a reading of the $I_{DS}$ for each input transistor 220', 220'' without pixel activation. If there is a stable output, i.e., a stable output of $I_{DS}$, the device is considered good, i.e., not noisy. Alternatively, if the output varies, i.e., a varying output of $I_{DS}$, the device is considered bad, i.e., noisy.

After determining which input transistor 220', 220'' is noisy and which input transistor 220', 220'' is not, each individual input transistor 220', 220'' is set to or maintained at a $V_{GS}/V_{BG}$ combination which provides the best noise performance, i.e., a $V_{GS}/V_{BG}$ combination which reduces the number of activated traps. More specifically, in embodiments, if the input transistor pair 220 is considered good, i.e., not noisy, the $V_{BG}$ applied to both input transistors 220', 220'' is maintained at a source supply voltage ($V_{SS}$). Examples of $V_{SS}$ values include 0V, i.e., ground or off, amongst other examples. Alternatively, for devices which are noisy, i.e., the input transistor pair 220 produces a varying output for $I_{DS}$, the training sequence applies an appropriate $V_{BG}$ to the back gate of the noisier input transistor out of the input transistors 220', 220'' of the input transistor pair 220 for selective tuning. In embodiments, for the noisy and/or noisier input transistor 220' or input transistor 220'', the training sequence switches the $V_{BG}$ from $V_{SS}$ to a drain voltage ($V_{DD}$). In this way, switching the back gate voltage comprises switching the back gate voltage from the $V_{SS}$ to $V_{DD}$ of at least one transistor of the input transistors 220', 220'' of the input transistor pair 220. In further embodiments, the switching of the back gate voltage further comprises switching a back gate voltage of a remaining transistor of the input transistors 220', 220'' of the input transistor pair 220 from the source supply voltage to the drain voltage $V_{DD}$.

Examples of $V_{DD}$ include 3V, i.e., on, amongst other examples. In this way, the back gate voltage of the noisier input transistor out of the input transistors 220', 220'' can be switched to either VDD=3V or $V_{SS}$=0V, i.e., switching the voltage on or off to reduce traps in the transistor pair when it has a varying output. As an example, if the input transistor 220' or input transistor 220'' is noisy and the $V_{SS}$ is at a value of 0V, switching the back gate voltage of the noisier input transistor out of the input transistors 220', 220'' to a $V_{DD}$ equal to 3V would indicate that the back gate voltage is being switched on. As another example, if the input transistor 220' or input transistor 220'' is noisy and is set with $V_{SS}$ at a value of 3V, where switching the back gate voltage of the noisier input transistor out of the input transistors 220', 220'' to a $V_{DD}$ equal to 0V would indicate that the voltage is being switched from on to off. In this way, the switching of the voltage on or off comprises changing a back gate voltage applied to the transistor pair 220 to deactivate the traps. In further embodiments, it is contemplated that $V_{BG}$ of the noisier input transistor out of the input transistors 220', 220'' is switched to a voltage which provides a stable output. For example, $V_{BG}$ could be set to a value equal to 0V, 1V, 2V, etc., and switched to a $V_{DD}$ which provides a stable output for $I_{DS}$.

The switching of $V_{BG}$ from $V_{SS}$ to $V_{DD}$ selectively tunes the back gate of the noisy input transistor 220' or input transistor 220'' by a voltage bias, thereby reducing the amount of RTN. Specifically, the voltage bias deactivates at least one trap of the traps located in the gate oxide of the input transistor pair 220, which are responsible for the RTN. More specifically, the traps are deactivated by the voltage bias. Selective deactivation of the traps reduces the amount of RTN present, thereby improving noise performance of the certain device, e.g., image signal processors. In this way, the noise performance of the input transistor pair 220 can be improved by up to approximately 45% by reducing an amount of RTN being generated, enabling a new class of very sensitive image signal processors. Additionally, by improving the noise performance using only two voltage levels for $V_{BG}$, i.e., the first level voltage $V_{SS}$ and the second level voltage $V_{DD}$, the circuits and processes described herein are relatively simple to integrate, thereby avoiding the need for additional circuits. For example, no back bias generator is needed because no new voltage needs to be generated to selectively tune the back gate of the input transistor, i.e., improve the noise performance of the device, since the voltages of $V_{SS}$ and $V_{DD}$ are already available.

In embodiments, each of the input transistors 220', 220" can have a memory associated with it so that the value of $V_{BG}$ is maintained. In this way, there is no need for constant monitoring the input transistors 220', 220", and also no need for further selective tuning. As an example, if a back gate of the noisier input transistor out of the input transistors 220', 220" is switched to a $V_{DD}$ of 3V, the back gate of the selectively tuned input transistor of the input transistors 220', 220" will remain at 3V for as long as the user desires, e.g., hours, days, weeks, months, etc. The same is also true for a back gate of the input transistor of the input transistors 220', 220" which is not switched, in that the back gate will remain set to $V_{SS}$ for as long as the user desires because of the memory associated with each of the input transistors 220', 220" of the input transistor pair 220. After $V_{BG}$ is appropriately configured to $V_{SS}$ or $V_{DD}$, the pixels of the image sensor, e.g., the image sensor 110, are activated. In embodiments, more than two voltage levels can be implemented, i.e., more than $V_{SS}$ and $V_{DD}$. The selective tuning of each of the input transistors 220', 220" can be repeated by the training sequence as desired. In further embodiments, the back gates of both input transistors 220', 220" can both be selectively tuned to reduce the amount of RTN present.

Figure 3:
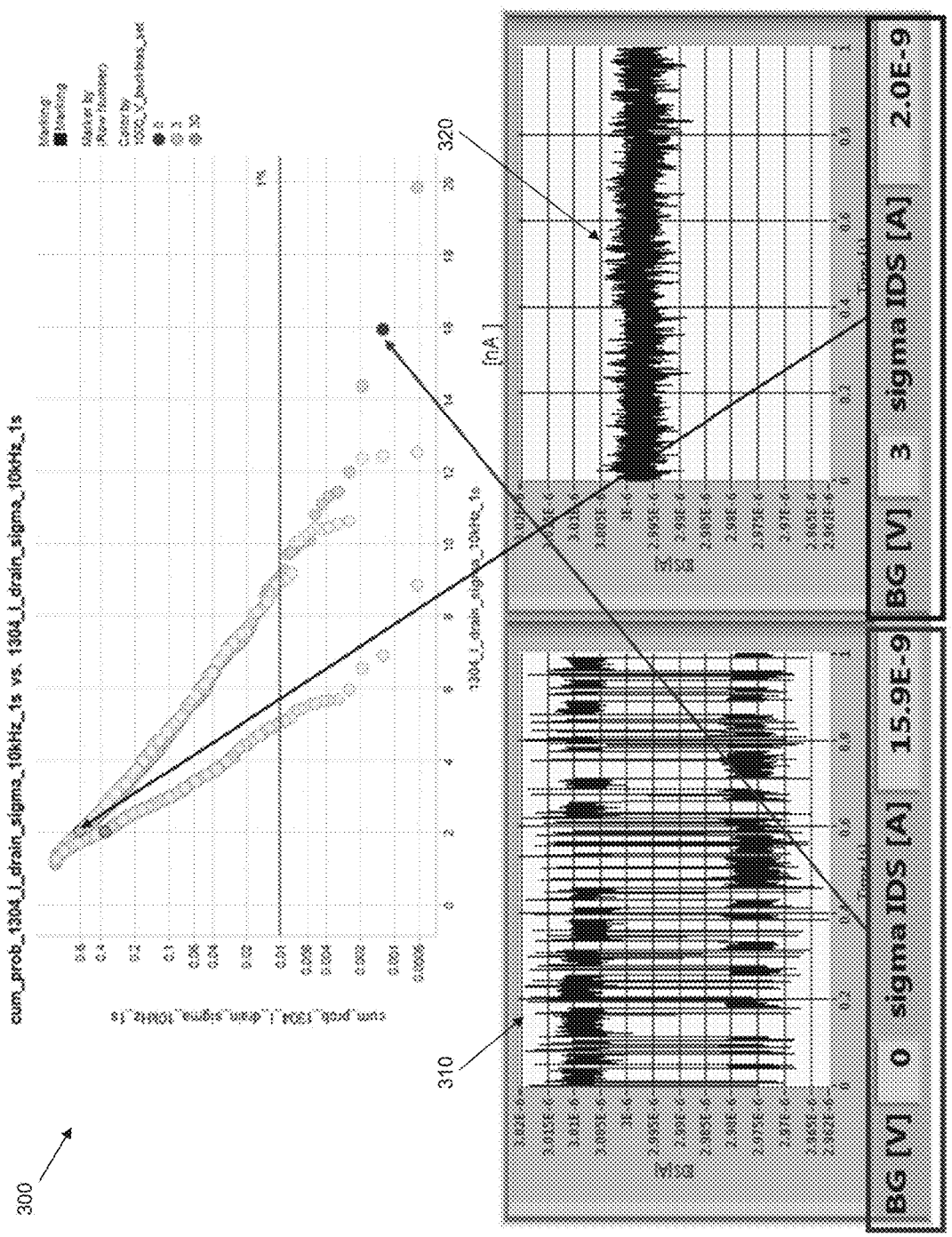
FIGS. 3 and 4 show switching off of random telegraph noise (RTN) by tuning the back gate of each device to 3V, amongst other features, in accordance with aspects of the present disclosure.
Figure 4:
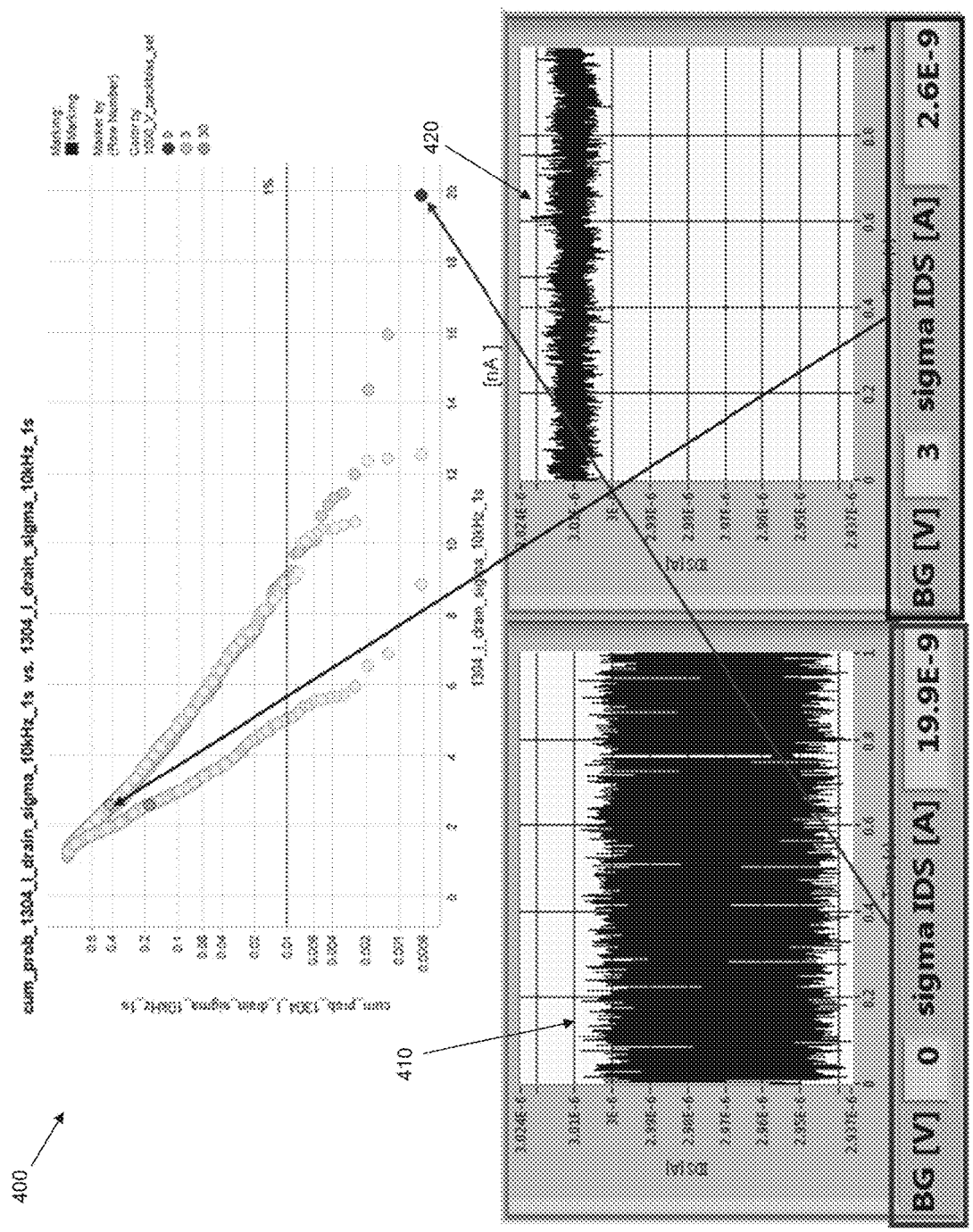

FIGS. 3-7 show the results of selective tuning the back gate for input transistors, e.g., input transistors 220', 220" of comparators of various devices. Specifically, FIGS. 3 and 4 show simulation results 300, 400 for devices in which the $I_{DS}$ 310, 410 is noisy when the training sequence begins by taking a reading of the $I_{DS}$ for each input transistor without pixel activation, i.e., at startup. As shown in FIGS. 3 and 4, the outputs of the $I_{DS}$ 310, 410 vary, and therefore the devices of FIGS. 3 and 4 are considered noisy, i.e., bad. Since the devices depicted in FIGS. 3 and 4 are noisy, the back gate of the noisy input transistor and/or noisier input transistor of the comparator in the device, e.g., input transistors 220', 220" of the comparator 125, is selectively tuned by switching the $V_{BG}$ from $V_{SS}$ to $V_{DD}$ to improve noise performance. Specifically, the back gate of either input transistor 220', 220" or both back gates of the input transistors 220', 220" is switched from 0V to 3V, i.e., $V_{BG}$ is switched from $V_{SS}$ to $V_{DD}$. In this way, the device has an improved noise performance as shown in the stable outputs of $I_{DS}$ 320, 420, in comparison to varying outputs $I_{DS}$ 310, 410 when the $V_{BG}$ was originally at $V_{SS}$.

Figure 5:
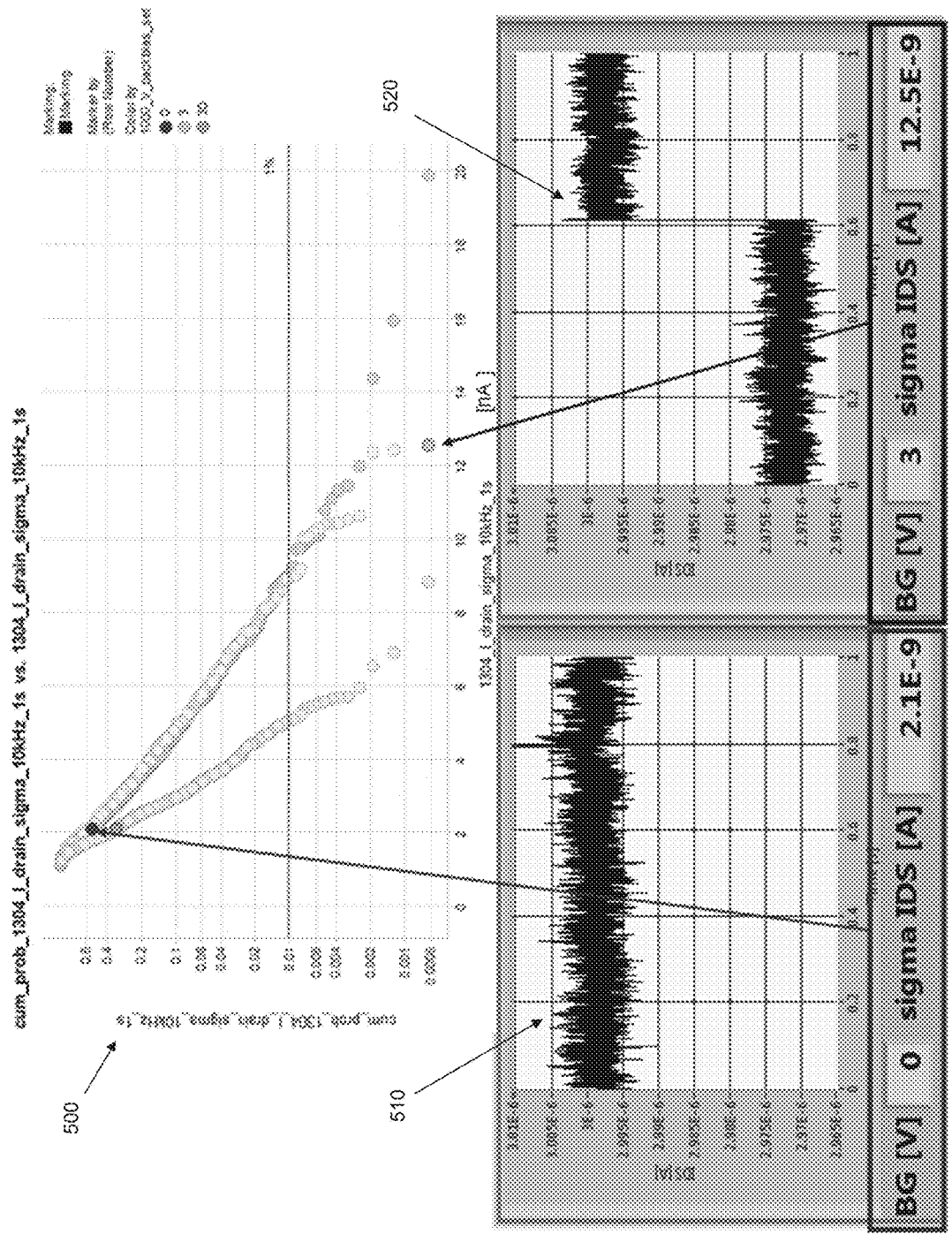
FIGS. 5 and 6 show the switching off of RTN by tuning a back gate of each device to 0V, amongst other features, in accordance with aspects of the present disclosure.
Figure 6:
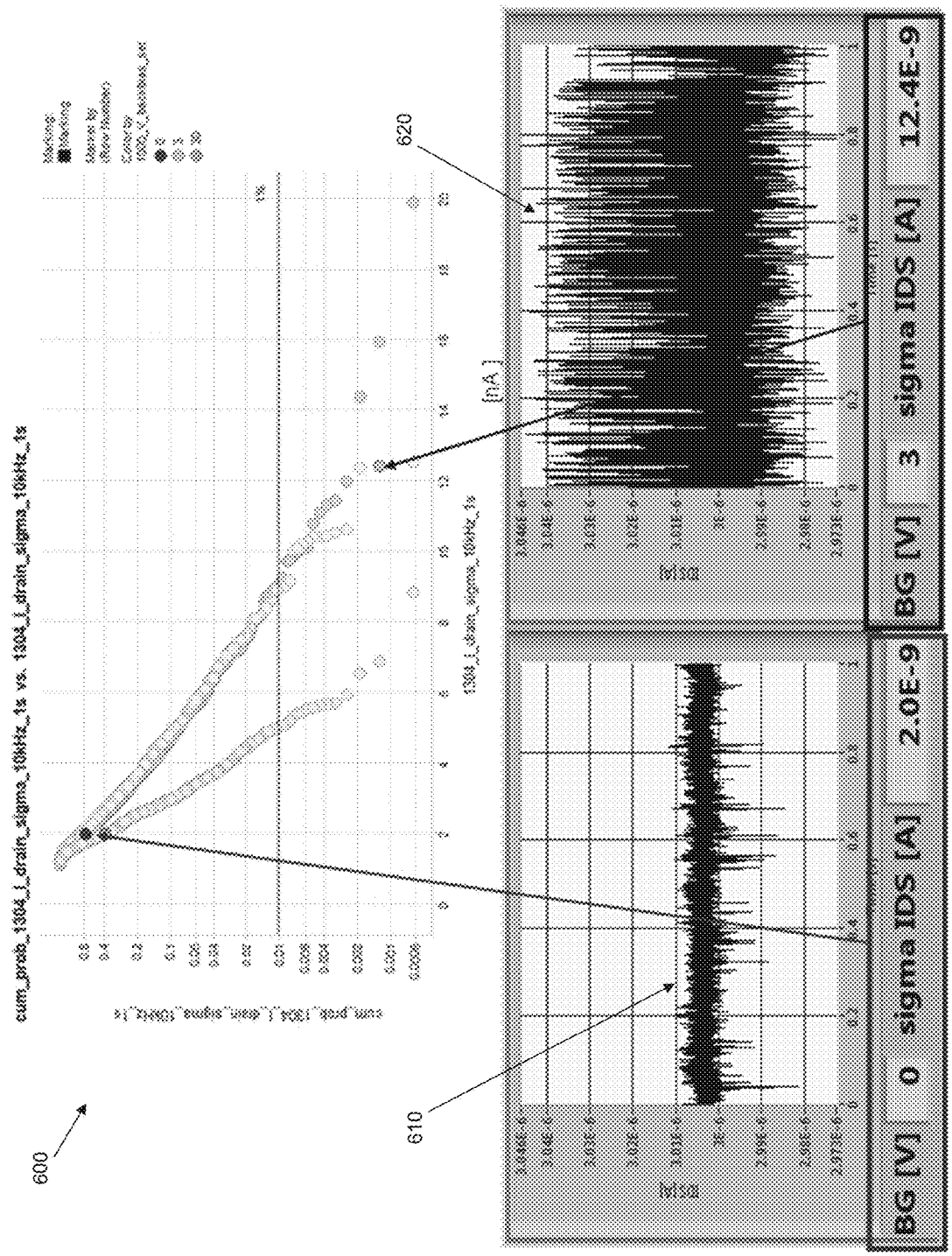

FIGS. 5 and 6 show the simulation results 500, 600 for devices in which the outputs of $I_{DS}$ 510, 610 are stable at startup, i.e., without pixel activation. In this way, the devices of FIGS. 5 and 6 are not noisy at startup and do not need a selective tuning of a back gate out of the input transistors in the comparator of the device. Further, if a back gate of an input transistor is tuned by switching $V_{BG}$ from $V_{SS}$ to $V_{DD}$, FIGS. 5 and 6 show that the outputs of $I_{DS}$ 520, 620 will now vary, thereby indicating that the devices are now noisy. In this way, the back gates of the input transistors of the comparators for the devices in FIGS. 5 and 6 should not be switched from $V_{SS}$ to $V_{DD}$. Alternatively, if either one of the simulation results 500, 600 showed that the output of $I_{DS}$ is not stable, i.e., that at least one of the input transistors in the comparator of the sensor processing circuit is noisy, which causes the device to be noisy, then the structures and processes described herein can implement additional features to improve noise performance. Specifically, the back gate of the noisier input transistor of the input transistor pair in the comparator would be selectively tuned by switching the $V_{BG}$ from $V_{SS}$ to $V_{DD}$. As an example, the back gate of each noisy input transistor would be switched from 0V to 3V, i.e., switching $V_{BG}$ from $V_{SS}$ to $V_{DD}$.

Figure 7:
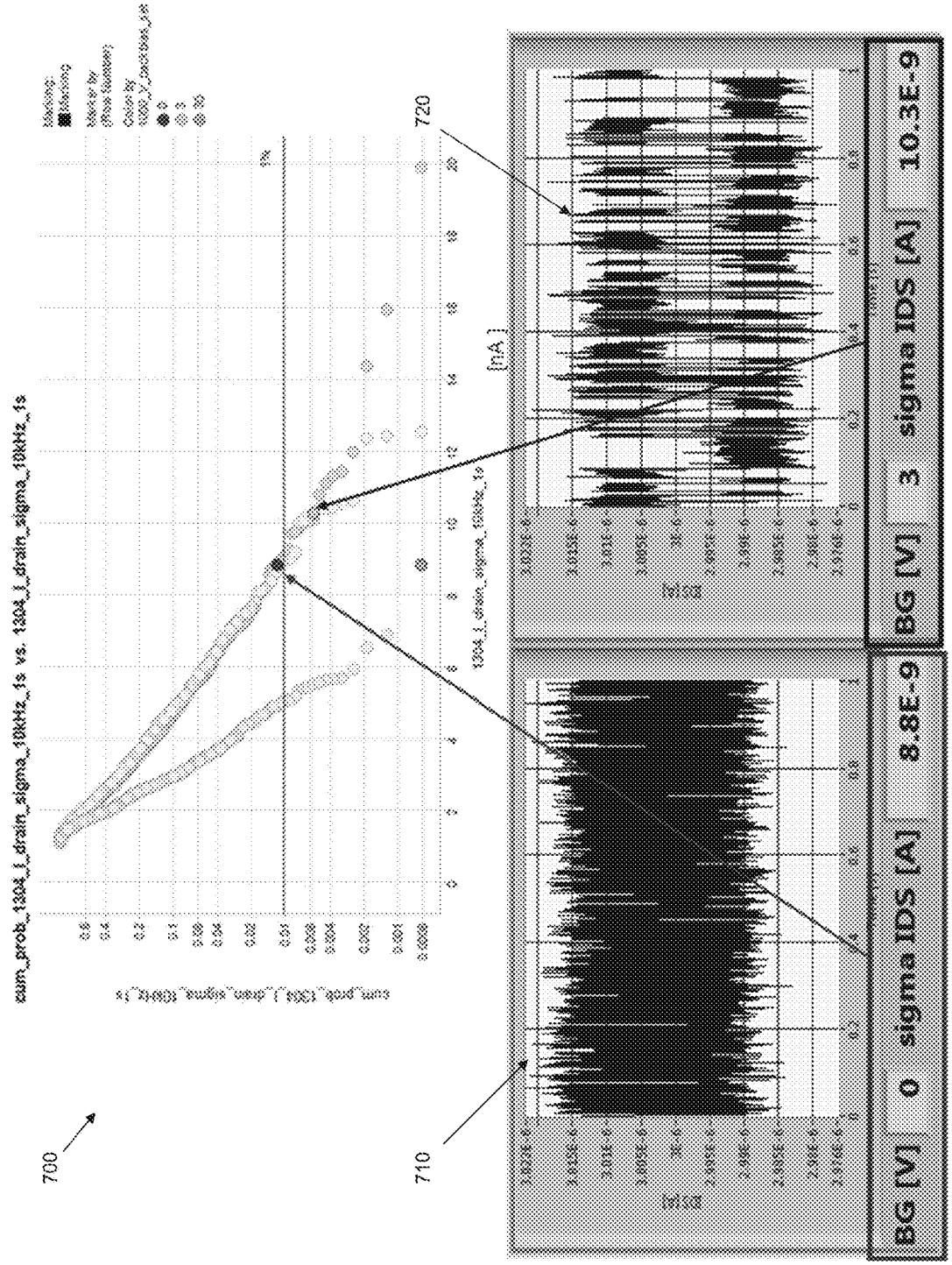
FIG. 7 shows a varying output for both outputs, amongst other features, in accordance with aspects of the present disclosure.

FIG. 7 illustrates embodiments in which the simulation results 700 are unstable and/or varying at both outputs, i.e., at startup and after switching the back gate voltage. Specifically, the $I_{DS}$ output 710 at startup is noisy, i.e., $V_{BG}$ is at $V_{SS}$ which is equal to 0V. That is, both input transistors of the input transistor pair are both noisy. Further, the $I_{DS}$ output 720 after switching $V_{BG}$ from $V_{SS}$ to $V_{DD}$ for either input transistor is still noisy. In this way, the input transistor pair is noisy at both $V_{BG}$ set to $V_{SS}$ or $V_{BG}$ set to $V_{DD}$. In this embodiment, a user can select which back gate voltage to set each input transistor at, i.e., $V_{SS}$ or $V_{DD}$, to which they desire.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects. Furthermore, aspects of the present disclosure may take the form of a computer program product embodied in one or more computer readable storage medium(s) having computer readable program code embodied thereon.

The computer readable storage medium (or media) having computer readable program instructions thereon causes one or more computing processors to carry out aspects of the present disclosure. The computer readable storage medium can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing.

A non-exhaustive list of more specific examples of the computer readable storage medium includes the following non-transitory signals: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, and any suitable combination of the foregoing. The computer readable storage medium is not to be construed as transitory signals per se; instead, the computer readable storage medium is a physical medium or device which stores the data. The computer readable program instructions may also be loaded onto a computer, for execution of the instructions, as shown in FIG. 8.

Figure 8:
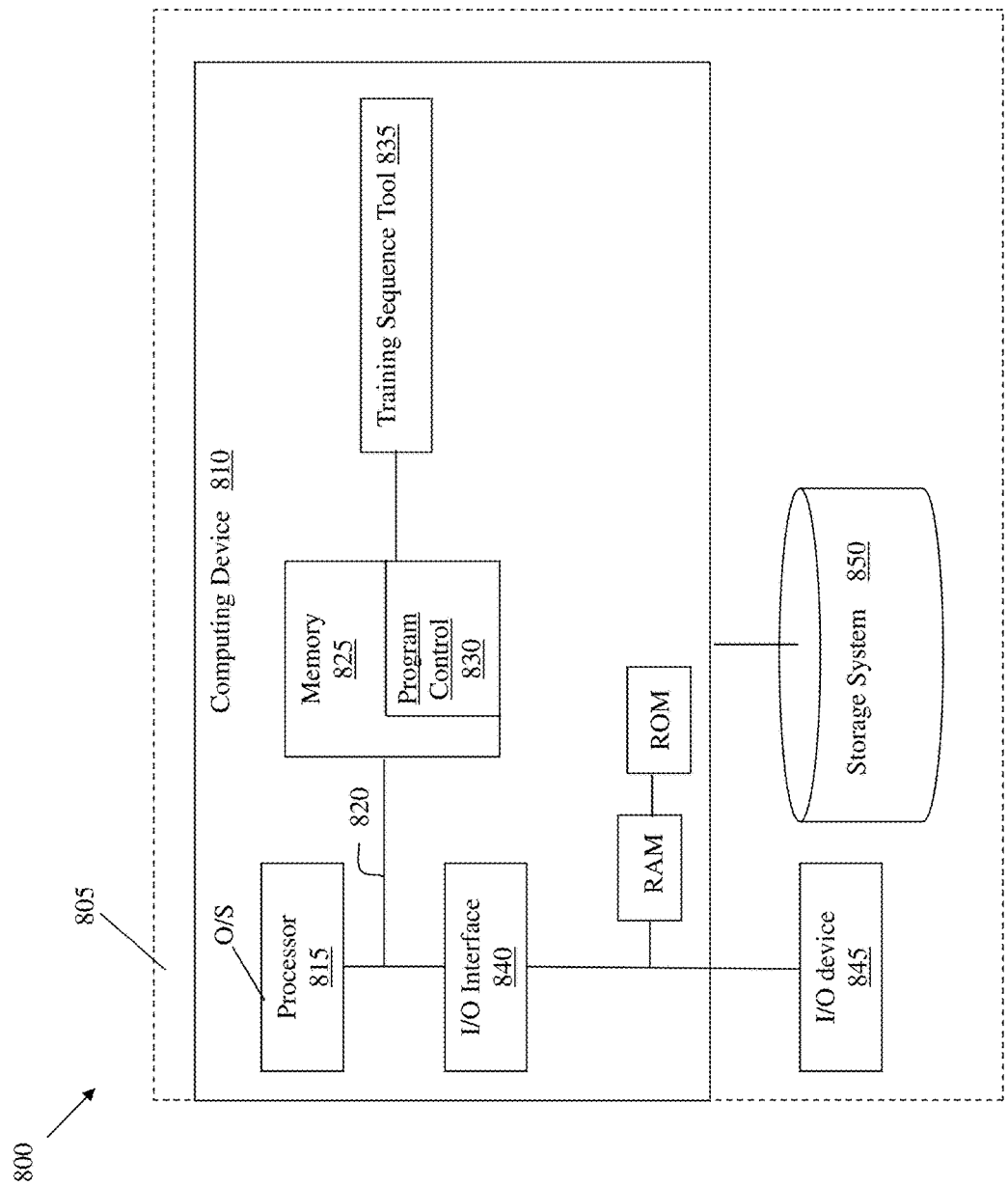
FIG. 8 shows an illustrative infrastructure for implementing the selective tuning of the back gate in accordance with aspects of the invention.

FIG. 8 shows a computer infrastructure 800 for implementing the steps in accordance with aspects of the disclosure. To this extent, the infrastructure 800 can implement the analysis and selective application of either maintaining the $V_{BG}$ at $V_{SS}$, or selectively tuning the back gate of each input transistor by switching the $V_{BG}$ to $V_{DD}$. The infrastructure 800 includes a server 805 or other computing system that can perform the processes described herein. In particular, the server 805 includes a computing device 810. The computing device 810 can be resident on a network infrastructure or computing device of a third party service provider (any of which is generally represented in FIG. 8).

The computing device 810 includes a processor 815 (e.g., CPU), memory 825, an I/O interface 840, and a bus 820. The memory 825 can include local memory employed during actual execution of program code, bulk storage, and cache memories which provide temporary storage of at least some program code in order to reduce the number of times code which are retrieved from bulk storage during execution. In addition, the computing device includes random access memory (RAM), a read-only memory (ROM), and an operating system (O/S).

The computing device 810 is in communication with external I/O device/resource 845 and storage system 850. For example, I/O device/resource 845 can comprise any device that enables an individual to interact with computing device 810 (e.g., user interface) or any device that enables computing device 810 to communicate with one or more other computing devices using any type of communications link. The external I/O device/resource 845 may be for example, a handheld device, PDA, handset, keyboard etc.

In general, processor 815 executes computer program code (e.g., program control 530), which can be stored in memory 825 and/or storage system 850. Moreover, in accordance with aspects of the invention, program control 830 controls a training sequence tool 835, which determines which devices are noisy and which devices are not, at a startup without pixel activation, and also selectively tunes the back gate of noisy input transistors in the comparators of devices to improve noise performance. The training sequence tool 835 can be implemented as one or more program codes in program control 830 stored in memory 825 as separate or combined modules. Additionally, the training sequence tool 835 may be implemented as separate dedicated processors or a single or several processors to provide the function of this tool. While executing the computer program code, the processor 815 can read and/or write data to/from memory 825, storage system 850, and/or I/O interface 840. The program code executes the processes of the invention. The bus 820 provides a communications link between each of the components in computing device 810.

The training sequence tool 835 is utilized to improve the noise performance of a device, e.g., image signal processor. In embodiments, the training sequence tool 835 is implemented at startup, i.e., without pixel activation. Specifically, the training sequence tool 835 executes a training sequence which begins by determining which input transistor out of the input transistor pair in the comparator is noisy and/or noisier and which input transistor is not, in view of an amount of RTN present at each individual input transistor out of the input transistor pair. In embodiments, the training sequence can be a multiple read out without pixel activation. In this way, the training sequence of the training sequence tool 835 begins by taking a reading of the $I_{DS}$ for each input transistor without pixel activation. If there is a stable output, i.e., a stable output of $I_{DS}$, the device is considered good, i.e., relatively noiseless. Alternatively, if the output varies, i.e., a varying output of $I_{DS}$, at least one of the input transistors is considered bad, i.e., noisy.

In embodiments, so that the initial $I_{DS}$ reading can occur, the training sequence tool 835 prevents pixel activation by having no light applied to the photodiode 102 of the image sensor 110. In this way, a reading of the comparator 125 in the sensor processing circuit 120 can be performed by the training sequence of the training sequence tool 835 without pixel activation. More specifically, the training sequence reads each individual input transistor 220', 220" of input transistor pair 220 in the comparator 125 to determine if at least one of the input transistors 220', 220" is noisy and/or noisier. In this way, the training sequence of the training sequence tool 835 determines which input transistor 220', 220", if any, needs the back gate selectively tuned by the training sequence tool 835 to improve noise performance.

After determining which input transistor 220', 220" is noisy and/or noisier and which input transistor is not, each individual input transistor of the input transistors 220', 220" is set to or maintained by the training sequence of the training sequence tool 835 to a $V_{GS}/V_{BG}$ combination which provides the best noise performance, i.e., a $V_{GS}/V_{BG}$ combination which reduces the number of activated traps in each input transistor of the input transistors 220', 220". In embodiments, the training sequence tool 835 maintains the $V_{BG}$ of a good (not noisy) input transistor of the input transistors 220', 220" at the $V_{SS}$. Alternatively, for the input transistor of the input transistors 220', 220" which is noisy, the training sequence tool 835 applies an appropriate $V_{BG}$ to the back gate of the noisy input transistor of the input transistors 220', 220" for selective tuning. In this way, the training sequence tool 835 switches the $V_{BG}$ from $V_{SS}$ to $V_{DD}$ for each noisy input transistor of the input transistors 220', 220".

The switching of $V_{BG}$ from $V_{SS}$ to $V_{DD}$ selectively tunes the back gate of the noisy input transistor of the input transistors 220', 220" by a voltage bias, thereby reducing the amount of RTN. Specifically, the voltage bias deactivates at least one trap of the traps located in the gate oxide of the input transistor of the input transistors 220', 220" which is found to be noisy and is responsible for the RTN. In this way, the deactivation of the at least one trap improves a noise performance of the device, i.e., input transistor pair 220, by reducing an amount of RTN being generated. Specifically, selective deactivation of the traps reduces the amount of RTN present, thereby improving a noise performance of the input transistors 220', 220", by having the active traps deactivated. In this way, the noise performance of the input transistor pair 220 can be improved by up to approximately 45% by the training sequence tool 835. Additionally, the training sequence tool 835 provides the benefit of using two levels for $V_{BG}$, e.g., the first level voltage $V_{SS}$ and the second level voltage $V_{DD}$. In this way, no back bias generator is needed because no new voltage needs to be generated to tune the back gate of the input transistors 220', 220" because $V_{SS}$ and $V_{DD}$ voltages are already available. In further embodiments, the back gates of both input transistors 220', 220" can be selectively tuned.

By selectively tuning the back gate of a noisy input transistor of the input transistors 220', 220" of the input transistor pair 220, the device, e.g., image signal processor, should have improved noise performance. In embodiments, after the selective tuning of the noisy input transistor pair 220, the training sequence of the training sequence tool 835 can implement a reading to verify that the noise performance of the device has improved, i.e., that the $I_{DS}$ output of the device is stable. In this way, the noise performance of the device is verified prior to pixel activation, i.e., prior to applying light to the photodiode 102.

Although the systems and methods described hereafter are with regard to exemplary methods, and/or computer program products, it should be understood that other implementations are also contemplated by the present disclosure as described herein. For example, other devices, systems, appliances, and/or computer program products according to embodiments of the present disclosure will be or become apparent to one of ordinary skill in the art upon review of the drawings and detailed description. It is intended that all such additional other devices, systems, appliances, processes, and/or computer program products be included within the scope of the present disclosure.

The circuits of the present disclosure can be manufactured in a number of ways using a number of different tools. In general, though, the methodologies and tools are used to form circuits with dimensions in the micrometer and nanometer scale. The methodologies, i.e., technologies, employed to manufacture the structure of the present disclosure have been adopted from integrated circuit (IC) technology. For example, the circuits are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
    applying a voltage to a back gate of a device; and
    selectively controlling the applied voltage to deactivate at least one trap within an insulating layer of the device to reduce noise contribution from the at least one trap, wherein the voltage applied to the back gate of the device is at a first level voltage or a second level voltage.

2. The method of claim 1, wherein the device is a transistor.

3. The method of claim 1, wherein the applying the voltage to the back gate of the device comprises applying a source supply voltage as the first level voltage.

4. The method of claim 3, wherein the selectively controlling the applied voltage comprises switching from the source supply voltage to the second level voltage which is a drain voltage (VDD) of at least one transistor of a transistor pair of the device.

5. The method of claim 4, further comprising switching a voltage of a remaining transistor of the transistor pair from the source supply voltage to the drain voltage VDD.

6. The method of claim 4, wherein the source supply voltage is a value of 0 volts.

7. The method of claim 4, wherein the drain voltage is a value of 3 volts.

8. The method of claim 1, wherein the first level voltage is a source supply voltage and the second level voltage is a drain voltage.

9. The method of claim 1, wherein the insulating layer is a gate oxide of the device.

10. The method of claim 9, wherein the deactivation of the at least one trap improves a noise performance of the device by reducing an amount of random telegraph noise being generated.

11. A method, comprising:
    determining a transistor pair has a stable output or a varying output;
    applying a voltage to a back gate of the transistor pair when it has the stable output; and
    selectively controlling the applied voltage on or off to reduce traps in the transistor pair when the transistor pair has the varying output, wherein the applying the voltage to the back gate of the transistor pair comprises maintaining the voltage at a source supply voltage.

12. The method of claim 11, wherein the selectively controlling the applied voltage on or off comprises changing a back gate voltage applied to the transistor pair to deactivate the traps.

13. The method of claim 12, wherein the selectively controlling the applied voltage on or off comprises switching from the source supply voltage to a drain voltage.

14. The method of claim 12, wherein the reducing the traps improves a noise performance of the transistor pair by reducing an amount of random telegraph noise being generated.

15. The method of claim 14, wherein the reducing the traps comprises deactivating the traps within a gate oxide of the transistor pair.

16. The method of claim 11, wherein the applying the source supply voltage to the back gate of the transistor pair comprises maintaining the voltage at 0V.

17. A system for improving noise performance, comprising:
    a CPU, a computer readable memory and a computer readable storage media;
    first program instructions to apply a source supply voltage to a back gate of a device; and
    second program instructions to selectively control the applied source supply voltage to deactivate at least one trap within an insulating layer of the device to reduce noise contribution from the at least one trap.

18. The system of claim 17, wherein the selectively controlling the applied voltage comprises switching the applied source supply voltage from the source supply voltage to a drain voltage.

19. The system of claim 18, wherein the source supply voltage is at 0V.

20. The system of claim 19, wherein the drain voltage is at 3V.

* * * * *